United States Patent
Hsu et al.

(10) Patent No.: US 10,574,217 B2
(45) Date of Patent: Feb. 25, 2020

(54) SLEW RATE ADJUSTING TRANSMITTER CIRCUIT

(71) Applicant: REALTEK SEMICONDUCTOR CORP., Hsinchu (TW)

(72) Inventors: Chih-Hsun Hsu, Taoyuan (TW); Chun-Hao Lai, Taipei (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/147,380

(22) Filed: Sep. 28, 2018

(65) Prior Publication Data

US 2019/0158076 A1 May 23, 2019

(30) Foreign Application Priority Data

Nov. 22, 2017 (TW) .............................. 106140558 A

(51) Int. Cl.
- H03K 5/01 (2006.01)
- H03K 6/04 (2006.01)
- H04L 25/02 (2006.01)

(52) U.S. Cl.
CPC ................. *H03K 5/01* (2013.01); *H03K 6/04* (2013.01); *H04L 25/028* (2013.01)

(58) Field of Classification Search
CPC ........... H03K 5/01; H03K 6/04; H04L 25/028
See application file for complete search history.

(56) References Cited

U.S. PATENT DOCUMENTS

| 4,987,318 A * | 1/1991 | Burke ................... H04L 25/028 326/125 |
| 5,134,308 A * | 7/1992 | Boemi ..................... H03K 5/01 327/130 |
| 5,317,206 A * | 5/1994 | Hanibuchi ....... H03K 19/00361 326/21 |
| 10,291,213 B2 * | 5/2019 | Elwan ............ H03K 19/017581 |
| 2012/0212251 A1 * | 8/2012 | Yanagishima .......... H02P 31/00 324/762.01 |
| 2019/0158076 A1 * | 5/2019 | Hsu .......................... H03K 6/04 |
| 2019/0356310 A1 * | 11/2019 | Sugie ................. H03K 17/6872 |

* cited by examiner

*Primary Examiner* — Adam D Houston
(74) *Attorney, Agent, or Firm* — Li & Cai Intellectual Property (USA) Office

(57) ABSTRACT

A transmitter circuit is provided in the present disclosure. The transmitter circuit includes a first capacitance, a first current pump circuit for charging or discharging the first capacitance to output a first voltage, a second capacitance, and a second current pump circuit for charging or discharging the second capacitance to output a second voltage. A charging rate at which the first current pump circuit charges the first capacitance or a discharging rate at which the first current pump circuit discharges the first capacitance determines a rising slew rate or a falling slew rate of the first voltage. A charging rate at which the second current pump circuit charges the second capacitance or a discharging rate at which the second current pump circuit discharges the second capacitance determines a rising slew rate or a falling slew rate of the second voltage.

20 Claims, 2 Drawing Sheets

SLEW RATE ADJUSTING TRANSMITTER CIRCUIT

BACKGROUND OF THE INVENTION

1. Field of the Invention

The present disclosure relates to a transmitter circuit; in particular, to a transmitter circuit being able to adjust a slew rate.

2. Description of Related Art

For a conventional transmitter circuit, it is necessary to provide different voltage signals in accordance with input signals and control a voltage slew rate, so that complicated circuits, voltage suppliers or current suppliers that are able to adjust voltage output and current output are required. However, the design thereof would complicate a circuit and a manufacturing process thereof, thereby increasing the costs associated therewith.

Therefore, it is an important issue in this industry to provide a transmitter circuit with a simple design that can adjust the voltage slew rate.

SUMMARY OF THE INVENTION

Accordingly, the instant disclosure provides a transmitter circuit including a first capacitance, a first current pump circuit, a second capacitance, a second current pump circuit, a first voltage clamping circuit, a second voltage clamping circuit, a third voltage clamping circuit, and a fourth voltage clamping circuit. The first capacitance has a first terminal and a second terminal electrically connected to a ground voltage. The first current pump circuit is electrically connected to the first terminal of the first capacitance and configured to charge the first capacitance or discharge the first capacitance in accordance with a first input signal to allow the first terminal of the first capacitance to output a first voltage. The second capacitance has a first terminal and a second terminal electrically connected to the ground voltage. The second current pump circuit is electrically connected to the first terminal of the second capacitance and configured to charge the second capacitance or discharge the second capacitance in accordance with a second input signal to allow the first terminal of the second capacitance to output a second voltage. The first voltage clamping circuit is electrically connected to the first terminal of the first capacitance. The second voltage clamping circuit is electrically connected to the first terminal of the first capacitance. The third voltage clamping circuit is electrically connected to the first terminal of the second capacitance. The fourth voltage clamping circuit is electrically connected to the first terminal of the second capacitance. A charging rate or a discharging rate at which the first current pump circuit charges or discharges the first capacitance determines a voltage slew rate of the first voltage, and a charging rate or a discharging rate at which the second current pump circuit charges or discharges the second capacitance determines a voltage slew rate of the second voltage. The first voltage and the second voltage are between a low reference voltage of the third voltage clamping circuit and the third voltage clamping circuit and a high reference voltage of the fourth voltage clamping circuit and the fourth voltage clamping circuit. When the first voltage or the second voltage reaches the low reference voltage or the high reference voltage, the first current pump circuit stops charging or discharging the first capacitance in accordance with the voltage clamping of the first voltage clamping circuit or the second voltage clamping circuit, and when the second voltage reaches the low reference voltage or the high reference voltage, the second current pump circuit stops charging or discharging the second capacitance in accordance with the voltage clamping of the third voltage clamping circuit or the fourth voltage clamping circuit.

Another embodiment of the instant disclosure provides a transmitter circuit including a first capacitance, a first current pump circuit, a first voltage clamping circuit, and a second voltage clamping circuit. The first capacitance has a first terminal and a second terminal electrically connected to a ground voltage. The first current pump circuit is electrically connected to the first terminal of the first capacitance and configured to charge or discharge the first capacitance in accordance with a first input signal to allow the first terminal of the first capacitance to output a first voltage. The first voltage clamping circuit is electrically connected to the first terminal of the first capacitance. The second voltage clamping circuit is electrically connected to the first terminal of the first capacitance. When the first current pump circuit charges the first capacitance according to the first input signal, the first terminal of the first capacitance outputs a first voltage, and when the first voltage reaches a high reference voltage, the second voltage clamping circuit performs voltage clamping such that the first voltage remains at the high reference voltage. When the first current pump circuit discharges the first capacitance according to the first input signal, the first terminal of the first capacitance outputs the first voltage, and when the first voltage reaches a low reference voltage, the first voltage clamping circuit performs voltage clamping such that the first voltage remains at the low reference voltage. When the first voltage reaches the low reference voltage or the high reference voltage, the first current pump circuit stops charging or discharging the first capacitance according to the voltage clamping of the first voltage clamping circuit or the second voltage clamping circuit.

According to another embodiment of the instant disclosure, the transmitter circuit includes a first capacitance, a first current pump circuit, a second capacitance, and a second current pump circuit. The first capacitance has a first terminal and a second terminal electrically connected to a ground voltage. The first current pump circuit is electrically connected to the first terminal of the first capacitance and configured to charge the first capacitance or discharge the first capacitance in accordance with a first input signal to allow the first terminal of the first capacitance to output a first voltage, in which the first voltage is between a low reference voltage and a high reference voltage. The second capacitance has a first terminal and a second terminal electrically connected to the ground voltage. The second current pump circuit electrically connected to the first terminal of the second capacitance and configured to charge the first capacitance or discharge the first capacitance in accordance with a second input signal to allow the first terminal of the second capacitance to output a second voltage, in which the second voltage is between the low reference voltage and the high reference voltage. A charging rate or a discharging rate at which the first current pump circuit charges or discharges the first capacitance determines an up-slew rate or a down-slew rate of the first voltage. A charging rate or a discharging rate at which the second current pump circuit charges or discharges the second capacitance determines an up-slew rate or a down-slew rate of the second voltage.

In summary, since the instant disclosure provides a transmitter circuit with a simple circuit structure capable of adjusting the voltage slew rate and controlling the circuits to adjust the slew rate through voltage clamping circuits, the circuit structure is simplified and the costs are reduced thereby.

In order to further the understanding of the present disclosure, reference is made to the following detailed description illustrating the embodiments and examples of the present disclosure. The description is for illustrative purpose only and is not intended to limit the scope of the claim.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the instant disclosure will be illustrated in the subsequent descriptions and appended drawings. The descriptions should not be taken as limitations to the scope of the instant disclosure. Specifically, in order to clearly demonstrate the instant disclosure, the relative size between components might be exaggerated.

Furthermore, although terms such as "the first", "the second" and "the third" might be used in the descriptions, the components are not limited by these terms. These terms are used merely for the purpose of distinguishing one component from the others. For instance, the component given the reference name "first component" can also be named "second component" and the result doesn't fall outside the scope of the instant disclosure.

Furthermore, in the following description, the left end of electrical components having two end points is the first terminal thereof, and the right end of these electrical components is the right end thereof. For electrical components with three end points, the reference to each one of which is accompanied by the reference number labeling the components.

[Embodiment of a Transmitter Circuit of the Instant Disclosure]

Figure 1:
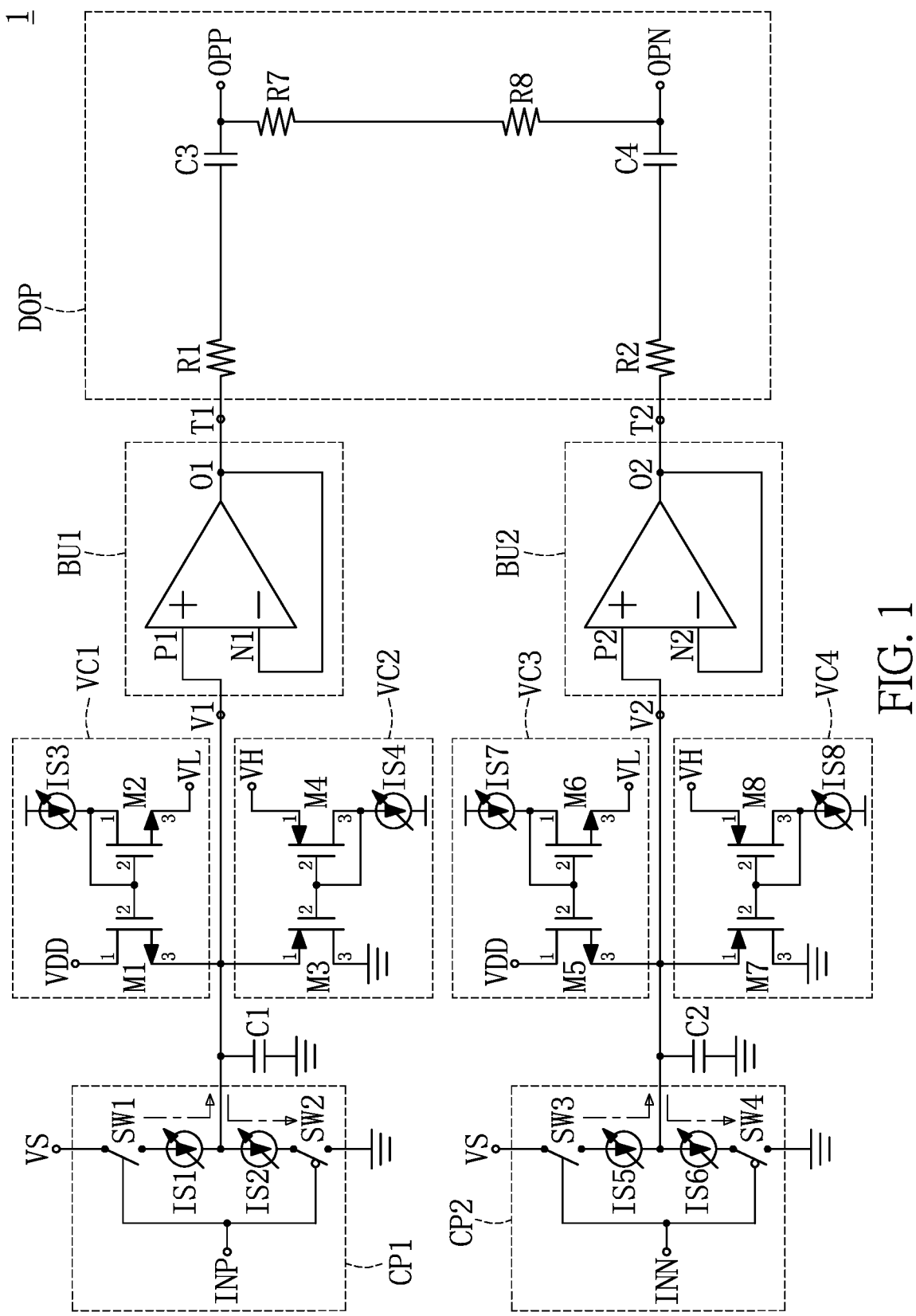
FIG. 1 is a schematic view of a transmitter circuit according to one embodiment of the instant disclosure.

Reference is made to FIG. 1. FIG. 1 is a schematic view illustrating a transmitter circuit according to one embodiment of the instant disclosure.

A transmitter circuit 1 includes a first current pump circuit CP1, a second current pump circuit CP2, a first capacitor C1, a second capacitor C2, a first voltage clamping circuit VC1, a second voltage clamping circuit VC2, a third voltage clamping circuit VC3, a fourth voltage clamping circuit VC4, a first voltage buffer BU1, a second voltage buffer BU2, and a differential output circuit DOP.

The first current pump circuit CP1, the first capacitor C1, the first voltage clamping circuit VC1, the second voltage clamping circuit VC2, and the first voltage buffer BU1 can be seen as a side circuit of a differential output circuit. Accordingly, the second current pump circuit CP2, the second capacitor C2, the third voltage clamping circuit VC3, the fourth voltage clamping circuit VC4 and the second voltage buffer BU2 are the other side circuit of the differential output circuit. That is to say, in other embodiments, either side circuit can be used to output voltage, and the instant disclosure is not limited thereto.

The first current pump circuit CP1 includes a first signal input terminal INP, and the second current pump circuit CP2 includes a second signal input terminal INN. The first signal input terminal INP of the first current pump circuit CP1 and the second signal input terminal INN of the second current pump circuit CP2 respectively receives an input signal to charge or discharge the first current pump circuit CP1 and the second current pump circuit CP2, and a first voltage V1 and a second voltage V2 are outputted thereby. In the present embodiment, the input signals received by the first signal input terminal INP and the second signal input terminal INN are successive signals or digital signals having a high voltage and a low voltage, which is adjustable according to particular implementation. The instant disclosure is not limited thereto.

In the present embodiment, the first current pump circuit CP1 is electrically connected to a first terminal of the first capacitor C1, a second terminal of the first capacitor C1 is connected to a ground voltage. The first voltage clamping circuit VC1 and the second voltage clamping circuit VC2 are electrically connected to the first terminal of the first capacitor C1 respectively. The first voltage buffer BU1 has a positive input terminal P1, a negative input terminal N1, and an output terminal O1. The positive input terminal P1 of the first voltage buffer BU1 is electrically connected to the first terminal of the first capacitor C1 so as to receive the first voltage V1 and output a steady first voltage V1. The output terminal O1 of the first voltage buffer BU1 is electrically connected to the negative input terminal N1 of the first voltage buffer BU1.

The second current pump circuit CP2 is electrically connected to a first terminal of the second capacitor C2, and a second terminal of the second capacitor C2 is electrically connected to a ground voltage. The third voltage clamping circuit VC3 and the fourth voltage clamping circuit VC4 are electrically connected to the first terminal of the second capacitor C2 respectively. The second voltage buffer BU2 has a positive input terminal P2, a negative input terminal N2, and an output terminal O2. The positive input terminal P2 of the second voltage buffer BU2 is electrically connected to the first terminal of the second capacitor C2 so as to receive the second voltage V2 and output a steady second voltage V2. The output terminal O2 of the second voltage buffer BU2 is electrically connected to the negative input terminal N2 of the second voltage buffer BU2.

A differential output circuit DOP includes a first input terminal T1, a second input terminal T2, a positive output terminal OPP, and a negative output terminal OPN. The first input terminal T1 of the differential output circuit DOP is electrically connected the output terminal O1 of the first voltage buffer BU1. The second input terminal T2 of the differential output circuit DOP is electrically connected to the output terminal O2 of the second voltage buffer BU2.

In the present embodiment, when the first current pump circuit CP1 is charging the first capacitor C1, that is to say, when the first voltage V1 of the first terminal of the first capacitor C1 keeps rising until it reaches a high reference voltage VH, the second voltage clamping circuit VC2 operates in cooperation with the first current pump circuit CP1 such that the first voltage V1 remains at the high reference voltage VH. In addition, when the first voltage clamping circuit VC1 clamps the first voltage V1, the first current pump circuit CP1 stops charging the first capacitor C1 correspondingly.

When the first current pump circuit CP1 discharges the first capacitor C1, that is, when the first voltage V1 of the first terminal of the first capacitor C1 keeps decreasing until it reaches a low reference voltage VL, the first voltage clamping circuit VC1 operates in cooperation with the first current pump circuit CP1 such that the first voltage V1 remains at the low reference voltage VL. Moreover, when the first voltage clamping circuit VC1 clamps the first voltage V1, the first current pump circuit CP1 stops discharging the first capacitor C1 correspondingly.

In the present embodiment, when the second current pump circuit CP2 charges the second capacitor C2, that is, when the second voltage V2 of the first terminal of the second capacitor C2 keeps rising until it reaches the high reference voltage VH, the fourth voltage clamping circuit VC4 operates in cooperation with the second current pump circuit CP2 such that the second voltage V2 remains at the high reference voltage VH. Furthermore, when the second voltage clamping circuit VC2 clamps the second voltage V2, the second current pump circuit CP2 stops charging the second capacitor C2 correspondingly.

When the second current pump circuit CP2 discharges the second capacitor C2, that is, when the second voltage V2 of the first terminal of the second capacitor C2 keeps decreasing until it reaches the low reference voltage VL, the third voltage clamping circuit VC3 operates in cooperation with the second current pump circuit CP2 such that the second voltage V2 remains at the low reference voltage VL. In addition, when the third voltage clamping circuit VC3 clamps the second voltage V2, the second current pump circuit CP2 stops discharging second capacitor C2 correspondingly.

In the present embodiment, a slew rate of the first voltage V1 is adjusted by controlling the level of a charging current or a discharging current provided by the first current pump circuit CP1. More specifically, a rising slew rate and a falling slew rate are adjusted by the level of the charging current or the discharging current provided by the first current pump circuit CP1. Similarly, a rising slew rate and a falling slew rate of the second voltage V2 are adjusted by the level of the charging current or the discharging current provided by the second current pump circuit CP2. That is to say, the rising slew rate and the falling slew rate of the first voltage V1 are determined by the rate at which the first current pump circuit CP1 charges or discharges the first capacitor C1. The rising slew rate and the falling slew rate of the second voltage V2 are determined by the rate at which the second current pump circuit CP2 charges or discharges the second capacitor C2.

In the present embodiment, the first current pump circuit CP1 includes a first current source IS1, a second current source IS2, a first switch SW1, and a second switch SW2, which are connected in series.

In the present embodiment, the first current source IS1 and the second current source IS2 are connected in series via a first switch SW1 and a second switch SW2, which are respectively controlled by the first signal input terminal INP. In the present embodiment, the first switch SW1 and the second switch SW2 will not be switched on at the same time; instead, one of the first switch SW1 and the second switch SW2 will be switched on in accordance with the input signal from the first signal input terminal INP such that the first current source IS1 or the second current source IS2 charges or discharges the first capacitor C1.

Similarly, the second current pump circuit CP2 includes a third switch SW3, a fourth switch SW4, a fifth current source IS5, and a sixth current source IS6, which are connected in series.

In the present embodiment, the fifth current source IS5 and the sixth current source IS6 are connected in series via the third switch SW3 and the fourth switch SW4, which are respectively controlled by the second signal input terminal INN. In the present embodiment, the third switch SW3 and the fourth switch SW4 will not be switched on at the same time; instead, one of the third switch SW3 and the fourth switch SW4 will be switched on in accordance with the input signal from the second signal input terminal INN such that the fifth current source IS5 or the sixth current source IS6 charges or discharges the second capacitor C2.

In addition, the first terminals of the first current source IS1 and the fifth current source IS5 are electrically connected to a reference voltage VS. The second terminals of the second current source IS2 and the sixth current source IS6 are electrically connected to a ground voltage.

The first voltage clamping circuit VC1 includes a first switch unit M1, a second switch unit M2, and a third current source IS3. The first switch unit M1 and the second switch unit M2 respectively have a first terminal, a second terminal and a third terminal. The first terminal of the first switch unit M1 is electrically connected to a reference voltage level VDD. The second terminal of the first switch unit M1 is electrically connected to the first terminal and the second terminal of the second switch unit M2. The third terminal of the first switch unit M1 is electrically connected to the first terminal of the first capacitor C1. The first terminal of the second switch unit M2 is electrically connected to the third current source IS3. The third terminal of the second switch unit M2 is electrically connected to a low reference voltage VL.

The second voltage clamping circuit VC2 includes a third switch unit M3, a fourth switch unit M4, and a fourth current source IS4. The third switch unit M3 and the fourth switch unit M4 respectively have a first terminal, a second terminal, and a third terminal. The first terminal of the third switch unit M3 is electrically connected to the first terminal of the first capacitor C1. The second terminal of the third switch unit M3 is electrically connected to the second terminal and the third terminal of the fourth switch unit M4. The third terminal of the third switch unit M3 is electrically connected to a ground voltage. The first terminal of the fourth switch unit M4 is electrically connected to the high reference voltage VH. The third terminal of the fourth switch unit M4 is electrically connected to a fourth current source IS4.

In the present embodiment, the second current pump circuit CP2 includes a fifth current source IS5, a sixth current source IS6, a third switch SW3, and a fourth switch SW4.

The third voltage clamping circuit VC3 includes a fifth switch unit M5, a sixth switch unit M6, and a seventh current source IS7. The fifth switch unit M5 and the sixth switch unit M6 respectively have a first terminal, a second terminal and a third terminal. The first terminal of the fifth switch unit M5 is electrically connected to the reference voltage level VDD. The second terminal of the fifth switch unit M5 is electrically connected to the first terminal and the second terminal of the sixth switch unit M6. The third terminal of the fifth switch unit M5 is electrically connected to the first terminal of the second capacitor C2. The first terminal of the sixth switch unit M6 is electrically connected to a seventh current source IS7. The third terminal of the sixth switch unit M6 is electrically connected to the low reference voltage VL. In the present embodiment, the voltage level can be adjusted according to particular implementation and the instant disclosure is not limited thereto.

The fourth voltage clamping circuit VC4 includes a seventh switch unit M7, an eighth switch unit M8, and an eighth current source IS8. The seventh switch unit M7 and the eighth switch unit M8 respectively have a first terminal, a second terminal and a third terminal. The first terminal of the seventh switch unit M7 is electrically connected to the first terminal of the second capacitor C2. The second terminal of the seventh switch unit M7 is electrically connected to the second terminal and the third terminal of the eighth switch unit M8. The third terminal of the seventh switch unit M7 is electrically connected to a ground voltage. The first terminal of the eighth switch unit M8 is electrically connected to the high reference voltage VH. The third terminal of the eighth switch unit M8 is electrically connected to the eighth current source IS8.

In the present embodiment, when the first current source IS1 of the first current pump circuit CP1 charges the first capacitor C1, the fourth current source IS4 of the second voltage clamping circuit VC2 operates correspondingly at the same time, and when a current passing through a current mirror circuit of the second voltage clamping circuit VC2 has the same current level that the first current source IS1 charges the first capacitor C1, the first voltage V1 of the first capacitor C1 will be clamped at the high reference voltage VH.

Similarly, when the second current source IS2 of the first current pump circuit CP1 discharges the first capacitor C1, the third current source IS3 of the first voltage clamping circuit VC1 operates correspondingly at the same time, and when the current passing through the current mirror circuit of the first voltage clamping circuit VC1 has the same current level that the second current source IS2 discharges the first capacitor C1, the first voltage V1 of the first capacitor C1 will be clamped at the low reference voltage VL.

In a similar manner, in the present embodiment, when the fifth current source IS5 of the second current pump circuit CP2 charges the second capacitor C2, the current mirror circuit of the third voltage clamping circuit VC3 operates correspondingly at the same time, and when the current passing through the current mirror circuit of the fourth voltage clamping circuit VC4 has the same current level that the fifth current source IS5 charges the second capacitor C2, the second voltage V2 of the second capacitor C2 will be clamped at the high reference voltage VH.

Similarly, when the sixth current source IS6 of the second current pump circuit CP2 discharges the second capacitor C2, the current mirror circuit of the fourth voltage clamping circuit VC4 operates correspondingly at the same time, and when the current passing through the current mirror circuit of the fourth voltage clamping circuit VC4 has the same current level that the sixth current source IS6 discharges the second capacitor C2, the second voltage V2 of the second capacitor C2 will be clamped at the low reference voltage VL.

In the present embodiment, the differential output circuit DOP includes a first resistor R1, a second resistor R2, a seventh resistor R7, an eighth resistor R8, a third capacitor C3, and a fourth capacitor C4. The first resistor R1, the third capacitor C3, and the seventh resistor R7 are connected in series. Similarly, the second resistor R2, the fourth capacitor C4, and the eighth resistor R8 are connected in series. The seventh resistor R7 and the eighth resistor R8 are connected in series.

In the present embodiment, a first terminal of the first resistor R1 is a first input terminal T1 of the differential output circuit DOP, and a first terminal of the second resistor R2 is a second input terminal T2 of the differential output circuit DOP. A second terminal of the third capacitor C3 is the positive output terminal OPP of the differential output circuit DOP, and a second terminal of the fourth capacitor C4 is the negative output terminal OPN of the differential output circuit DOP. In the present embodiment, the differential output circuit DOP is for outputting the steady first voltage V1 and second voltage V2 so as to output two differential output signals. Therefore, the actual circuit structure is not limited to the present embodiment; instead, the current structure can be adjusted according to particular implementation.

[Another Embodiment of the Transmitter Circuit of the Present Disclosure]

Figure 2:
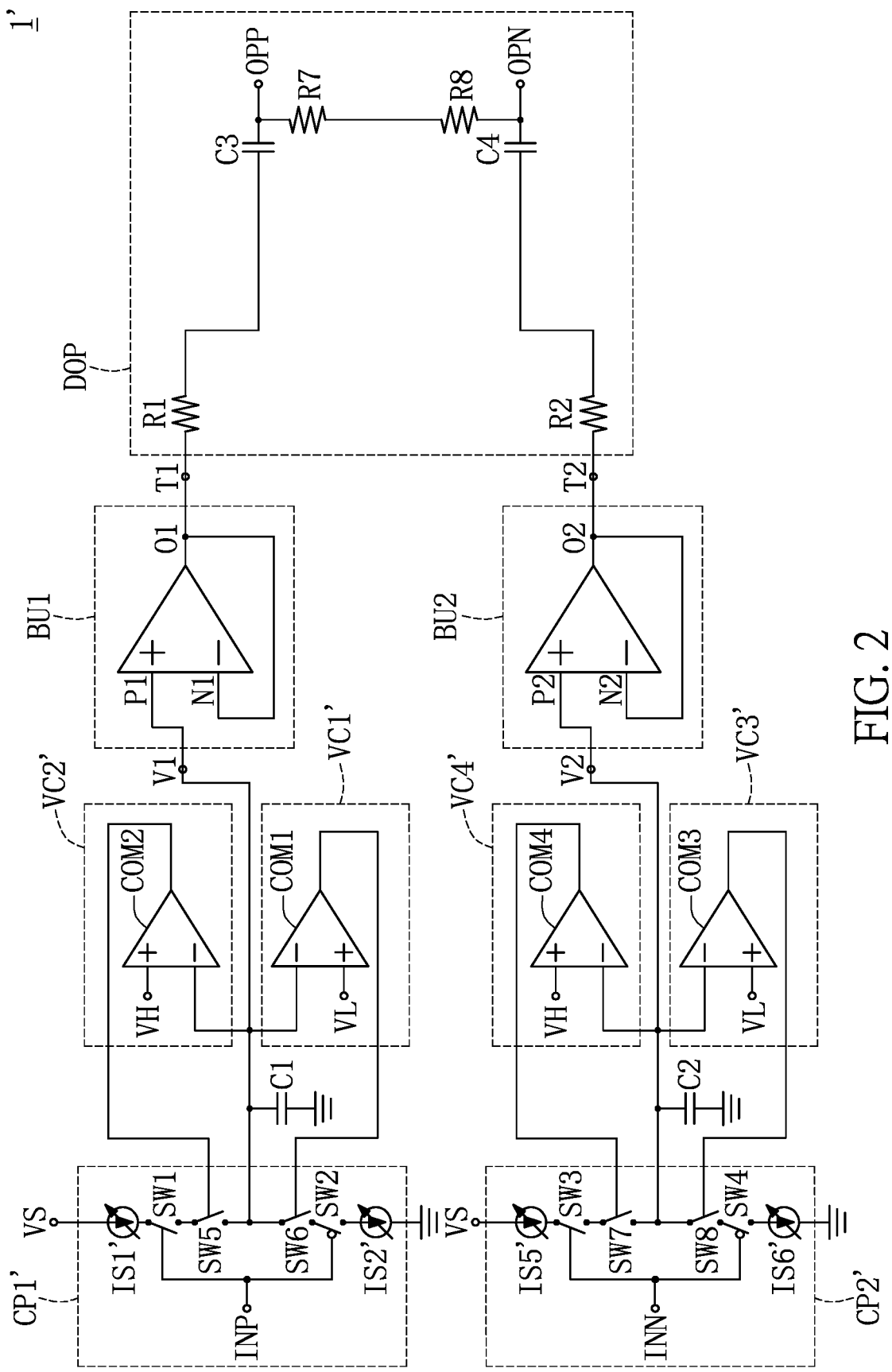
FIG. 2 is another schematic view of the transmitter circuit according to the embodiment of the instant disclosure.

Reference is made to FIG. 2, which illustrates a schematic view of the transmitter circuit according to another embodiment of the instant disclosure.

In the present embodiment, the transmitter circuit 1' has a similar structure as the transmitter circuit 1 of the previous embodiment. However, a first current pump circuit CP1', a second current pump circuit CP2', a first voltage clamping circuit VC1', a second voltage clamping circuit VC2', a third voltage clamping circuit VC3', and a fourth voltage clamping circuit VC4' of the transmitter circuit 1' are distinguishable from the first current pump circuit CP1, the second current pump circuit CP2, the first voltage clamping circuit VC1, the second voltage clamping circuit VC2, the third voltage clamping circuit VC3, and the fourth voltage clamping circuit VC4 of the transmitter circuit 1. The difference therebetween will be described below.

The transmitter circuit 1' includes a first current pump circuit CP1', a second current pump circuit CP2', a first capacitor C1, a second capacitor C2, a first voltage clamping circuit VC1', a second voltage clamping circuit VC2', a third voltage clamping circuit VC3', fourth voltage clamping circuit VC4', a first voltage buffer BU1, a second voltage buffer BU2, and a differential output circuit DOP. Specifically, the first current pump circuit CP1', the first capacitor C1, the first voltage clamping circuit VC1', the second voltage clamping circuit VC2' and the first voltage buffer BU1 can be taken as a side circuit of the differential output circuit DOP. On the contrary, the second current pump circuit CP2', the second capacitor C2, the third voltage clamping circuit VC3', the fourth voltage clamping circuit VC4' and the second voltage buffer BU2 can be seen as the other side circuit of the differential output circuit DOP.

The first current pump circuit CP1' includes a first signal input terminal INP, and the second current pump circuit CP2' includes a second signal input terminal INN. The first signal input terminal INP of the first current pump circuit CP1' and the second signal input terminal INN of the second current pump circuit CP2' respectively receive an input signal that adjusts the operations of the first current pump circuit CP1' and the second current pump circuit CP2' to charge or discharge the first capacitor C1 or the second capacitor C2 respectively, and a first voltage V1 and a second voltage V2 are outputted thereby.

In the present embodiment, the first current pump circuit CP1' is electrically connected to the first terminal of the first capacitor C1, and the second terminal of the first capacitor C1 is electrically connected to ground voltage. The first voltage clamping circuit VC1' and the second voltage clamping circuit VC2' are electrically connected to the first terminal of the first capacitor C1 respectively. The first voltage buffer BU1 has a positive input terminal P1, a negative input terminal N1, and an output terminal O1. The positive input terminal P1 of the first voltage buffer BU1 is electrically connected to the first terminal of the first capacitor C1 so as to receive the first voltage V1 and output the steady first voltage V1. The output terminal O1 of the first voltage buffer BU1 is electrically connected to the negative input terminal N1 of the first voltage buffer BU1.

The second current pump circuit CP2' is electrically connected to the first terminal of the second capacitor C2, the second terminal of the second capacitor C2 is electrically connected to the ground voltage. The third voltage clamping circuit VC3' and the fourth voltage clamping circuit VC4' are electrically connected to the first terminal of the second capacitor C2 respectively. The second voltage buffer BU2 includes a positive input terminal P2, a negative input terminal N2, and an output terminal O2. The positive input terminal P2 of the second voltage buffer BU2 is electrically connected to the first terminal of the second capacitor C2 so as to receive the second voltage V2 and output the steady second voltage V2. The output terminal O2 of the second voltage buffer BU2 is electrically connected to the negative input terminal N2 of the second voltage buffer BU2.

The differential output circuit DOP includes a first input terminal T1, a second input terminal T2, a positive output terminal OPP, and a negative output terminal OPN. The first input terminal T1 of the differential output circuit DOP is electrically connected to the output terminal O1 of the first voltage buffer BU1. The second input terminal T2 of the differential output circuit DOP is electrically connected to the output terminal O2 of the second voltage buffer BU2.

In the present embodiment, when the first current pump circuit CP1' charges the first capacitor C1, that is, when the first voltage V1 of the first terminal of the first capacitor C1 keeps rising until it reaches the high reference voltage VH, the second voltage clamping circuit VC2' starts operating such that the first voltage V1 remains at the high reference voltage VH. When the first current pump circuit CP1' discharges the first capacitor C1, that is, when the first voltage V1 of the first terminal of the first capacitor C1 keeps decreasing until it reaches the low reference voltage VL, the first voltage clamping circuit VC1' starts operating such that the first voltage V1 remains at the low reference voltage VL.

In the present embodiment, when the second current pump circuit CP2' charges the second capacitor C2, that is, when the second voltage V2 of the first terminal of the second capacitor C2 keeps rising until it reaches the high reference voltage VH, the fourth voltage clamping circuit VC4' starts operating such that the second voltage V2 remains at the high reference voltage VH. When the second current pump circuit CP2' discharges the second capacitor C2, that is, when the second voltage V2 of the first terminal of the second capacitor C2 keeps decreasing until it reaches the low reference voltage VL, the third voltage clamping circuit VC3' starts operating such that the second voltage V2 remains at the low reference voltage VL.

The first current pump circuit CP1' includes a first switch SW1, a second switch SW2, a first current source IS1', and a second current source IS2'.

In the present embodiment, the first current source IS1' and the second current source IS2' are connected in series via the first switch SW1 and the second switch SW2, which are controlled by the first signal input terminal INP respectively. In the present embodiment, the first switch SW1 and the second switch SW2 will not be switched on at the same time; instead, one of the first switch SW1 and the second switch SW2 will be switched on in accordance with the input signal from the first signal input terminal INP such that the first current source IS1' or the second current source IS2' charges or discharges the first capacitor C1.

Similarly, the second current pump circuit CP2' includes a third switch SW3, a fourth switch SW4, a fifth current source IS5', and a sixth current source IS6'.

In the present embodiment, the fifth current source IS5' and the sixth current source IS6' are connected in series via the third switch SW3 and the fourth switch SW4, which are respectively controlled by the second signal input terminal INN. In the present embodiment, the third switch SW3 and the fourth switch SW4 will not be switched on at the same time; instead, one of the third switch SW3 and the fourth switch SW4 will be switched on in accordance with the input signal from the second signal input terminal INN such that the fifth current source IS5' or the sixth current source IS6' charges or discharges the second capacitor C2.

In the present embodiment, the first current pump circuit CP1' further includes a fifth switch SW5 and a sixth switch SW6, which are connected to the first switch SW1 and the second switch SW2 in series respectively. The sixth switch SW6 is electrically connected to the first voltage clamping circuit VC1', which means the fifth switch SW5 is controlled by the second voltage clamping circuit VC2' and the sixth switch SW6 is controlled by the first voltage clamping circuit VC1'.

In addition, first terminals of the first current source IS1' and the fifth current source IS5' are electrically connected to the reference voltage VS, and second terminals of the second current source IS2' and the sixth current source IS6' are electrically connected to a ground voltage.

In the present embodiment, the first voltage clamping circuit VC1' includes a first comparator COM1, and the second voltage clamping circuit VC2' includes a second comparator COM2. Specifically, a negative input terminal of the first comparator COM1 is electrically connected to the first terminal of the first capacitor C1, and a positive input terminal of the first comparator COM1 is electrically connected to the low reference voltage VL. An output terminal of the first comparator COM1 outputs a control signal to control the sixth switch SW6, that is, to control the second current source IS2' to the discharge the first capacitor C1. A negative input terminal of the second comparator COM2 is electrically connected to the first terminal of the first capacitor C1, and positive input terminal of the second comparator COM2 is electrically connected to the high reference voltage VH. An output terminal of the second comparator COM2 outputs a control signal to control the fifth switch SW5, that is, to control the first current source IS1' to charge the first capacitor C1.

In a similar manner, the second current pump circuit CP2' further includes a seventh switch SW7 and an eighth switch SW8, which are connected to the third switch SW3 and the fourth switch SW4 in series respectively. Specifically, the seventh switch SW7 is electrically connected to the fourth voltage clamping circuit VC4'. The eighth switch SW8 is electrically connected to the third voltage clamping circuit VC3'. That is to say, the seventh switch SW7 is controlled by the fourth voltage clamping circuit VC4', and the eighth switch SW8 is controlled by the third voltage clamping circuit VC3'.

In the present embodiment, the third voltage clamping circuit VC3' includes a third comparator COM3, and the fourth voltage clamping circuit VC4' includes a fourth comparator COM4. Specifically, a negative input terminal of the third comparator COM3 is electrically connected to the first terminal of the second capacitor C2, the positive input terminal of the third comparator COM3 is electrically connected to the low reference voltage VL. An output terminal of the third comparator COM3 outputs a control signal to control the eighth switch SW8. A negative input terminal of the fourth comparator COM4 is electrically connected to the first terminal of the first capacitor C1, and a positive input terminal of the fourth comparator COM4 is electrically connected to the high reference voltage VH. An output terminal of the fourth comparator COM4 outputs a control signal to control the seventh switch SW7.

In the present embodiment, the differential output circuit DOP of the transmitter circuit 1' has the same circuit structure as the differential output circuit DOP of the transmitter circuit 1. Therefore, the structure of the differential output circuit DOP will be not further described herein.

In summary, the instant disclosure provides a transmitter circuit with a simple circuit structure capable of adjusting the voltage slew rate and controlling the circuits to adjust the slew rate through voltage clamping circuits, so that the circuit structure is simplified and the costs are reduced thereby.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A transmitter circuit, comprising:
    a first capacitance having a first terminal and a second terminal, the second terminal of the first capacitance being electrically connected to a ground voltage;
    a first current pump circuit electrically connected to the first terminal of the first capacitance and configured to charge or discharge the first capacitance in accordance with a first input signal to allow the first terminal of the first capacitance to output a first voltage;
    a second capacitance having a first terminal and a second terminal, the second terminal of the second capacitance being electrically connected to the ground voltage;
    a second current pump circuit electrically connected to the first terminal of the second capacitance and configured to charge or discharge the first capacitance in accordance with a second input signal to allow the first terminal of the second capacitance to output a second voltage;
    a first voltage clamping circuit electrically connected to the first terminal of the first capacitance;
    a second voltage clamping circuit electrically connected to the first terminal of the first capacitance;
    a third voltage clamping circuit electrically connected to the first terminal of the second capacitance; and
    a fourth voltage clamping circuit electrically connected to the first terminal of the second capacitance;
    wherein a charging rate and a discharging rate at which the first current pump circuit charges and discharges the first capacitance determines a voltage slew rate of the first voltage, and a charging rate and a discharging rate at which the second current pump circuit charges and discharges the second capacitance determines a voltage slew rate of the second voltage;
    wherein the first voltage and the second voltage are between a low reference voltage of the first voltage clamping circuit and the third voltage clamping circuit and a high reference voltage of the second voltage clamping circuit and the fourth voltage clamping circuit;
    and wherein when the first voltage or the second voltage reaches the low reference voltage or the high reference voltage, the first current pump circuit stops charging or discharging the first capacitance in accordance with voltage clamping of the first voltage clamping circuit or the second voltage clamping circuit, and when the second voltage reaches the low reference voltage or the high reference voltage, the second current pump circuit stops charging or discharging the second capacitance in accordance with voltage clamping of the third voltage clamping circuit or the fourth voltage clamping circuit.

2. The transmitter circuit according to claim 1, wherein the first current pump circuit includes:
    a first current source, and
    a second current source;
    wherein the first current source is electrically connected to the first capacitance and charges the first capacitance, and the second current source is electrically connected to the first capacitance and discharges the first capacitance, in which the first current source and the second current source stop charging or discharging the first capacitance in accordance with the voltage clamping of the first voltage clamping circuit or the second voltage clamping circuit,
    wherein the second current pump circuit includes:
    a fifth current source; and
    a sixth current source;
    wherein the fifth current source is electrically connected to the second capacitance and charges the second capacitance, and the sixth current source is electrically connected to the second capacitance and charges the second capacitance, in which the fifth current source and the sixth current source stop charging or discharging the second capacitance in accordance with the voltage clamping of the third voltage clamping circuit or the fourth voltage clamping circuit.

3. The transmitter circuit according to claim 1, further comprising:
    a first voltage buffer electrically connected to the first terminal of the first capacitance and receiving the first voltage so as to steadily output the first voltage; and
    a second voltage buffer electrically connected to the first terminal of the second capacitance and receiving the second voltage so as to steadily output the second voltage.

4. The transmitter circuit according to claim 2, further comprising:
    a differential output circuit including a first input terminal and a second input terminal, in which the first input terminal is electrically connected to an output terminal of the first voltage buffer so as to receive the first voltage, and the second input terminal is electrically connected to an output terminal of the second voltage buffer so as to receive the second voltage,
    wherein the transmitter circuit outputs two differential output signals through the differential output circuit.

5. The transmitter circuit according to claim 2, wherein the first voltage clamping circuit includes:
    a first switch unit having a first terminal, a second terminal and a third terminal, the first terminal of the first switch unit being electrically connected to a reference voltage, and the third terminal of the first switch unit being electrically connected to the first terminal of the first capacitance; and
    a second switch unit having a first terminal, a second terminal and a third terminal, the first terminal of the second switch unit being electrically connected to a third current source, the first terminal of the second switch unit being electrically connected to the second terminal of the second switch unit and the second terminal of the first switch unit, and the third terminal of the second switch unit being electrically connected to a low reference voltage, wherein the second voltage clamping circuit includes:
- a third switch unit having a first terminal, a second terminal and a third terminal, the first terminal of the third switch unit being electrically connected to the first terminal of the first capacitance, and the third terminal of the third switch unit being electrically connected to the ground voltage; and
- a fourth switch unit having a first terminal, a second terminal and a third terminal, the first terminal of the fourth switch unit being electrically connected to a high reference voltage, the third terminal of the fourth switch unit being electrically connected to the second terminal of the fourth switch unit and the second terminal of the third switch unit, and the third terminal of the fourth switch unit being electrically connected to a fourth current source.

6. The transmitter circuit according to claim 5, wherein the third voltage clamping circuit includes:
- a fifth switch unit having a first terminal, a second terminal and a third terminal, the first terminal of the fifth switch unit being electrically connected to the reference voltage, and the third terminal of the fifth switch unit being electrically connected to the first terminal of the second capacitance; and
- a sixth switch unit having a first terminal, a second terminal and a third terminal, the first terminal of the sixth switch unit being electrically connected to a seventh current source, the first terminal of the sixth switch unit being electrically connected to the second terminal of the sixth switch unit and the second terminal of the fifth switch unit, and the third terminal of the sixth switch unit being electrically connected to the low reference voltage, wherein the fourth voltage clamping circuit includes:
- a seventh switch unit having a first terminal, a second terminal and a third terminal, the first terminal of the seventh switch unit being electrically connected to the first terminal of the second capacitance, and the third terminal of the seventh switch unit being electrically connected to the ground voltage; and
- an eighth switch unit having a first terminal, a second terminal and a third terminal, the first terminal of the eighth switch unit being electrically connected to the high reference voltage, the third terminal of the eighth switch unit being electrically connected to the second terminal of the eight switch unit and the second terminal of the seventh switch unit, and the third terminal of the eight switch unit being electrically connected to an eighth current source.

7. The transmitter circuit according to claim 2, wherein the first voltage clamping circuit includes:
- a first comparator having a positive input terminal, a negative input terminal, and an output terminal, in which the positive input terminal of the first comparator is electrically connected to the low reference voltage, the negative input terminal of the first comparator is electrically connected to the first terminal of the first capacitance, and the output terminal of the first comparator is used for outputting a control signal so as to control the second current source; and
- a second comparator having a positive input terminal, a negative input terminal, and an output terminal, in which the positive input terminal of the second comparator is electrically connected to the high reference voltage, the negative input terminal of the second comparator is electrically connected to the first terminal of the first capacitance, and the output terminal of the second comparator is used for outputting a control signal so as to control the first current source.

8. The transmitter circuit according to claim 7, wherein the third voltage clamping circuit includes:
- a third comparator having a positive input terminal, a negative input terminal, and an output terminal, the positive input terminal of the third comparator being electrically connected to the low reference voltage, the negative input terminal of the third comparator being electrically connected to the first terminal of the first capacitance, and the output terminal of the third comparator being used for outputting a control signal so as to control the sixth current source; and
- a fourth comparator having a positive input terminal, a negative input terminal, and an output terminal, the positive input terminal of the fourth comparator being electrically connected to the high reference voltage, the negative input terminal of the fourth comparator being electrically connected to the first terminal of the second capacitance, and the output terminal of the fourth comparator being used for outputting a control signal so as to control the fifth current source.

9. A transmitter circuit, comprising:
- a first capacitance having a first terminal and a second terminal, the second terminal of the first capacitance being electrically connected to a ground voltage;
- a first current pump circuit electrically connected to the first terminal of the first capacitance and configured to charge or discharge the first capacitance in accordance with a first input signal to allow the first terminal of the first capacitance to output a first voltage;
- a first voltage clamping circuit electrically connected to the first terminal of the first capacitance;
- a second voltage clamping circuit electrically connected to the first terminal of the first capacitance, wherein when the first current pump circuit charges the first capacitance according to the first input signal, the first terminal of the first capacitance outputs a first voltage, and when the first voltage reaches a high reference voltage, the second voltage clamping circuit performs voltage clamping such that the first voltage remains at the high reference voltage, wherein when the first current pump circuit discharges the first capacitance according to the first input signal, the first terminal of the first capacitance outputs the first voltage, and when the first voltage reaches a low reference voltage, the first voltage clamping circuit performs voltage clamping such that the first voltage remains at the low reference voltage, wherein a charging rate or a discharging rate at which the first current pump circuit charges or discharges the first capacitance determines a rising slew rate or a falling slew rate of the first voltage, and wherein when the first voltage reaches the low reference voltage or the high reference voltage, the first current pump circuit stops charging or discharging the first capacitance according to the voltage clamping of the first voltage clamping circuit or the second voltage clamping circuit.

10. The transmitter circuit according to claim 9, wherein the first current pump circuit includes: a first current source and a second current source charging or discharging the first capacitance in accordance with the first input signal.

11. The transmitter circuit according to claim 9, further comprising:
a first voltage buffer electrically connected to the first terminal of the first capacitance and receiving the first voltage so as to steadily output the first voltage.

12. The transmitter circuit according to claim 10, wherein the first voltage clamping circuit includes:
a first switch unit having a first terminal, a second terminal and a third terminal, the first terminal of the first switch unit being electrically connected to a reference voltage, and the third terminal of the first switch unit being electrically connected to the first terminal of the first capacitance; and
a second switch unit having a first terminal, a second terminal and a third terminal, the first terminal of the second switch unit being electrically connected to a third current source, the first terminal of the second switch unit being electrically connected to the second terminal of the second switch unit and the second terminal of the first switch unit, and the third terminal of the second switch unit being electrically connected to a low reference voltage,
wherein the second voltage clamping circuit includes:
a third switch unit having a first terminal, a second terminal and a third terminal, the first terminal of the third switch unit being electrically connected to the first terminal of the first capacitance, and the third terminal of the third switch unit being electrically connected to the ground voltage; and
a fourth switch unit having a first terminal, a second terminal and a third terminal, the first terminal of the fourth switch unit being electrically connected to a high reference voltage, the third terminal of the fourth switch unit being electrically connected to the second terminal of the fourth switch unit and the second terminal of the third switch unit, and the third terminal of the fourth switch unit being electrically connected to a fourth current source.

13. The transmitter circuit according to claim 9, wherein the first voltage clamping circuit includes:
a first comparator having a positive input terminal, a negative input terminal, and an output terminal, in which the positive input terminal of the first comparator is electrically connected to the low reference voltage, the negative input terminal of the first comparator is electrically connected to the first terminal of the first capacitance, and the output terminal of the first comparator is used for outputting a control signal so as to control the first current source; and
the second voltage clamping circuit includes:
a second comparator having a positive input terminal, a negative input terminal, and an output terminal, in which the positive input terminal of the second comparator is electrically connected to the high reference voltage, the negative input terminal of the second comparator is electrically connected to the first terminal of the first capacitance, and the output terminal of the second comparator is used for outputting a control signal so as to control the second current source.

14. A transmitter circuit, comprising:
a first capacitance having a first terminal and a second terminal, the second terminal of the first capacitance being electrically connected to a ground voltage;
a first current pump circuit electrically connected to the first terminal of the first capacitance and configured to charge or discharge the first capacitance in accordance with a first input signal to allow the first terminal of the first capacitance to output a first voltage, wherein the first voltage is between a low reference voltage and a high reference voltage;
a second capacitance having a first terminal and a second terminal, the second terminal of the second capacitance being electrically connected to the ground voltage;
a second current pump circuit electrically connected to the first terminal of the second capacitance and configured to charge or discharge the first capacitance in accordance with a second input signal to allow the first terminal of the second capacitance to output a second voltage, wherein the second voltage is between the low reference voltage and the high reference voltage,
wherein a charging rate or a discharging rate at which the first current pump circuit charges or discharges the first capacitance determines arising slew rate or a falling slew rate of the first voltage,
and wherein the charging rate or discharging rate at which the second current pump circuit charges or discharges the second capacitance determines the rising slew rate or falling slew rate of the second voltage.

15. The transmitter circuit according to claim 14, wherein when the first voltage reaches the low reference voltage or the high reference voltage, the first current pump circuit stops charging or discharging the first capacitance in accordance with the voltage clamping of a first voltage clamping circuit or a second voltage clamping circuit;
when the second voltage reaches the low reference voltage or the high reference voltage, the second current pump circuit stops charging or discharging the second capacitance in accordance with a third voltage clamping circuit or a fourth voltage clamping circuit.

16. The transmitter circuit according to claim 15, wherein the first current pump circuit includes:
a first current source, and
a second current source;
wherein the first current source is electrically connected to the first capacitance and charges the first capacitance, and the second current source is electrically connected to the first capacitance and discharges the first capacitance, in which the first current source and the second current source stop charging or discharging the first capacitance in accordance with the voltage clamping of the first voltage clamping circuit or the second voltage clamping circuit,
wherein the second current pump circuit includes:
a fifth current source; and
a sixth current source;
wherein the fifth current source is electrically connected to the second capacitance and charges the second capacitance, and the sixth current source is electrically connected to the second capacitance and discharges the second capacitance, in which the fifth current source and the sixth current source stop charging or discharging the second capacitance in accordance with the voltage clamping of the third voltage clamping circuit or the fourth voltage clamping circuit.

17. The transmitter circuit according to claim 15, further comprising:
a first voltage buffer electrically connected to the first terminal of the first capacitance and receiving the first voltage so as to steadily output the first voltage; and
a second voltage buffer electrically connected to the first terminal of the second capacitance and receiving the second voltage so as to steadily output the second voltage.

18. The transmitter circuit according to claim 15, further comprising:

a differential output circuit including a first input terminal and a second input terminal, in which the first input terminal is electrically connected to an output terminal of the first voltage buffer so as to receive the first voltage, and the second input terminal is electrically connected to an output terminal of the second voltage buffer so as to receive the second voltage, wherein the transmitter circuit outputs two differential output signals through the differential output circuit.

19. The transmitter circuit according to claim 15, wherein the first voltage clamping circuit includes:

a first switch unit having a first terminal, a second terminal and a third terminal, the first terminal of the first switch unit being electrically connected to a reference voltage, and the third terminal of the first switch unit being electrically connected to the first terminal of the first capacitance; and a second switch unit having a first terminal, a second terminal and a third terminal, the first terminal of the second switch unit being electrically connected to a third current source, the first terminal of the second switch unit being electrically connected to the second terminal of the second switch unit and the second terminal of the first switch unit, and the third terminal of the second switch unit being electrically connected to a low reference voltage, wherein the second voltage clamping circuit includes:

a third switch unit having a first terminal, a second terminal and a third terminal, the first terminal of the third switch unit being electrically connected to the first terminal of the first capacitance, and the third terminal of the third switch unit being electrically connected to the ground voltage; and a fourth switch unit having a first terminal, a second terminal and a third terminal, the first terminal of the fourth switch unit being electrically connected to a high reference voltage, the third terminal of the fourth switch unit being electrically connected to the second terminal of the fourth switch unit and the second terminal of the third switch unit, and the third terminal of the fourth switch unit being electrically connected to a fourth current source.

20. The transmitter circuit according to claim 15, wherein the third voltage clamping circuit includes:

a fifth switch unit having a first terminal, a second terminal and a third terminal, the first terminal of the fifth switch unit being electrically connected to the reference voltage, and the third terminal of the fifth switch unit being electrically connected to the first terminal of the second capacitance; and a sixth switch unit having a first terminal, a second terminal and a third terminal, the first terminal of the sixth switch unit being electrically connected to a seventh current source, the first terminal of the sixth switch unit being electrically connected to the second terminal of the sixth switch unit and the second terminal of the fifth switch unit, and the third terminal of the sixth switch unit being electrically connected to the low reference voltage, wherein the fourth voltage clamping circuit includes:

a seventh switch unit having a first terminal, a second terminal and a third terminal, the first terminal of the seventh switch unit being electrically connected to the first terminal of the second capacitance, and the third terminal of the seventh switch unit being electrically connected to the ground voltage; and an eighth switch unit having a first terminal, a second terminal and a third terminal, the first terminal of the eighth switch unit being electrically connected to the high reference voltage, the third terminal of the eighth switch unit being electrically connected to the second terminal of the eight switch unit and the second terminal of the seventh switch unit, and the third terminal of the eight switch unit being electrically connected to an eighth current source.

* * * * *